United States Patent [19]

Lohstroh

[11] Patent Number: 4,595,942

[45] Date of Patent: Jun. 17, 1986

[54] INTEGRATED CIRCUIT

[75] Inventor: Jan Lohstroh, Eindhoven, Netherlands

[73] Assignee: U.S. Philips Corporation, New York, N.Y.

[21] Appl. No.: 934,955

[22] Filed: Aug. 18, 1978

[30] Foreign Application Priority Data

Nov. 17, 1977 [NL] Netherlands ............................ 7712649

[51] Int. Cl.[4] ..................... H01L 27/04; H03K 19/091
[52] U.S. Cl. .......................................... 357/44; 357/15;
357/46; 357/48; 357/92; 307/458; 307/477
[58] Field of Search .......................... 357/15, 44, 46, 36, 357/48, 92

[56] References Cited

U.S. PATENT DOCUMENTS

| | | | |
|---|---|---|---|
| 3,482,111 | 12/1969 | Gunderson et al. | 357/44 |
| 3,617,827 | 11/1971 | Schmitz et al. | 357/44 |
| 3,676,714 | 7/1972 | Wensink et al. | 357/44 |
| 4,027,180 | 5/1977 | Ring | 307/303 |
| 4,032,962 | 6/1977 | Balyoz et al. | 357/68 |

OTHER PUBLICATIONS

Poorter, IEEE J. of Solid-State Circuits, vol. SC-12, No. 5, Oct. 1977, pp. 447-449.
Berger et al., IBM Tech. Discl. Bulletin, vol. 20, No. 2, Jul. 1977, pp. 636-637.
Peltier, IEEE ISSCC, Dig. Tech. Papers, Feb. 1975, pp. 168-169.
IEEE J of Solid State circuits, vol. SC-11, No. 5, Oct. 1976, pp. 637-643, by Tomisawa et al.

*Primary Examiner*—William D. Larkins
*Attorney, Agent, or Firm*—Robert T. Mayer

[57] ABSTRACT

A compact integrated logic circuit having an inverter transistor and several coupling diodes adjoining the collector region of said transistor. Current is applied to the base of the transistor which forms the signal input. The inverter transistor has additional means by which an effective complementary auxiliary transistor is incorporated which dissipates a considerable part of the base current in the case the inverter transistor is overdriven so that the charge storage in the inverter transistor is restricted and controlled and by which a Schottky clamp diode across the base-collector junction of the inverter transistor can be avoided.

3 Claims, 6 Drawing Figures

INTEGRATED CIRCUIT

CROSS REFERENCE TO RELATED APPLICATIONS

This application discloses subject matter that is similar in some respects to that disclosed in concurrently filed, copending application Ser. No. 934,954 of the same inventor herein, entitled "Integrated logic circuit".

The invention relates to an integrated logic circuit having a signal input which is formed by a base of a bipolar transistor and having a plurality of signal outputs each coupled, via a diode, to the collector of the bipolar transistor, the signal input comprising means to supply current, the integrated circuit comprising a semiconductor body having a major surface to which several surface regions of a first conductivity type adjoin which are situated on a common substrate region of a second conductivity type opposite to the first, each of said surface regions being surrounded at the major surface by an isolation zone by means of which the surface regions are isolated electrically from each other at least during operation, one of the said surface regions of the first conductivity type serving as a collector region of the bipolar transistor, said bipolar transistor furthermore having a major surface-adjoining emitter zone of the first conductivity type which is separated from the collector region in the semiconductor body by a base zone of the second conductivity type extending up to the major surface and which forms a first p-n junction with said base zone, the base zone forming a second p-n junction with the collector region, an electrically insulating layer being present on the major surface and having a first aperture which overlies the emitter zone, a second aperture which is situated beside the emitter zone and above the base zone, and several third apertures which are situated beside the base zone and above the collector region, the insulating layer separating conductor tracks from the semiconductor body which extend into the first, the second and the third apertures for electric connection, the conductor tracks extending into the third apertures being each coupled to the collector region via a rectifying junction which adjoins the collector region.

Said circuit is known from "1975 IEEE International Solid-State Circuits Conference", Digest of Technical Papers, February, 1975, pp. 168-169 and is described as being very attractive for large-scale integrated logic circuits (LSI). The basic cell is a NAND-gate in which the coupling diodes at the signal outputs are provided as Schottky diodes. In addition the cell also comprises a Schottky diode which is connected in parallel with the collector-base junction of the transistor. Said Schottky diode (clamp diode) has a diode forward voltage differing from that of the coupling diodes. The swing of the logic signal, that is the voltage difference between the signals representing a logic 1 and a logic 0, respectively, is equal to the difference in diode forward voltage of the two mutually different types of Schottky diodes. As a result of this, said swing can be comparatively small, which improves of the switching speed of the cell. The minimum delay time of the cell is comparable to that of the version of TTL with Schottky diode clamping and low dissipation which is sometimes referred to by the abbreviation LS TTL. Furthermore, the cell is particularly compact and the product of delay time and power dissipation is also attractively low.

Although said attractive LSI logic was announced nearly three years ago now, it has up till now not resulted in commercial products which have found acceptance in the market, at least in as far as the inventor is aware.

It is the object of the present invention to provide measures to arrive at an attractive product which can be produced at competitive prices and be marketed starting from said known LSI logic, and the invention is inter alia based on the recognition of the fact that the manufacture can be simplified considerably by modification of the integrated circuit described and, also as a result of this, the cost-price can be reduced considerably, while at the same time the attractive electrical properties and the high packing density desired for integration can nevertheless be maintained for the greater part.

Surprisingly it has been found in experiments conducted in connection with the invention that, by means of special measures in the semiconductor structure which do not require any extra operations during the manufacture, an auxiliary transistor coupled to the bipolar switching transistor can be realized which makes it possible to omit the clamp diode without thereby causing the switching speed of the cell to be unduly reduced.

According to the invention, an integrated logic circuit of the kind described in the preamble is characterized in that additional measures have been taken in the semiconductor structure of the bipolar transistor as a result of which a region of the second conductivity type cooperates effectively with the said base zone and the said collector region of the first conductivity type so that a complementary auxiliary transistor is incorporated which has the said base zone as emitter, has the collector region of the first conductivity type as base and has the region of the second conductivity type as collector, the last-mentioned region having an electric connection, and as a result of which, if the bipolar transistor is overdriven, a considerable part of the current flowing in the base zone of the bipolar transistor can flow through the auxiliary transistor and the storage of mobile charge carriers in the overdriven bipolar transistor can be restricted considerably.

The proposed integrated logic circuit with an inverter transistor having coupling diodes integrated on or in the collector region and an effective built-in complementary auxiliary transistor provides a considerable improvement with respect to LS TTL. The switching speed of the gate circuit can be at least equal to that of LS TTL while the power consumption can be considerably smaller; the packing density may be in addition approximately a factor two to six larger. Of extremely great importance is the fact that the said improvement is realized without this necessitating a comparatively complicated manufacturing process. The manufacturing process necessary for the proposed integrated circuit can involve the same process steps which are used for LS-TTL. It is the more important and also the more surprising that by means of the present invention such a considerable improvement with respect to LS-TTL can be realized.

In an important preferred embodiment of the integrated circuit according to the invention the complementary auxiliary transistor is realized as a vertical transistor. In this embodiment the collector region has a high-ohmic and a low-ohmic part extending at and along the interface between the collector region and the substrate, and this embodiment is further characterized in that the extent of the low-ohmic part of the collector region of the first conductivity type in a direction substantially parallel to the major surface is restricted, said low-ohmic part extending below the emitter zone and below the rectifying junctions but does not extend below part of said base zone underlying the second aperture in the insulating layer, whereby a region of the high-ohmic part of the collector region directly adjoins the substrate region to form a third p-n junction, the part of the substrate region adjoining the high-ohmic part of the collector region cooperating as a collector of the auxiliary transistor with the adjoining collector region and the base zone of the bipolar transistor. In this embodiment the thickness of the high-ohmic part of the collector region measured between the second and the third p-n junction preferably is at most 5 μm.

Said vertical auxiliary transistor which causes excessive base current of the inverter transistor to flow away via the substrate region proves to be a particularly effective means to restrict the overdrive of the inverter transistor and to reduce the storage of mobile minority charge carriers in said transistor so that comparatively short switching times are realized.

In another important preferred embodiment of the integrated circuit according to the invention the complementary auxiliary transistor is incorporated as a lateral transistor. This embodiment is characterized in that a further surface zone of the second conductivity type adjoining the collector region of the first conductivity type is present at the major surface and beside the base zone and extends into the semiconductor body from the major surface down to substantially the same depth as the base zone, said further zone serving as a collector of the auxiliary transistor and being connected to the substrate region.

Said further surface zone can simply be provided simultaneously with the base zone so that the distance between said zones can be comparatively small. The distance at the major surface between the base zone and the further surface zone is preferably at most 5 μm.

The vertical and the horizontal auxiliary transistor may also be combined advantageously in the same bipolar transistor of an integrated circuit according to the invention.

The invention will be described in greater detail with reference to a few embodiments and the accompanying drawing, in which

FIGS. 3 and 4 are diagrammatic cross-sectional views of said part of the first embodiment taken on the lines III—III and IV—IV, respectively, of FIG. 2, and in which

Figure 1:
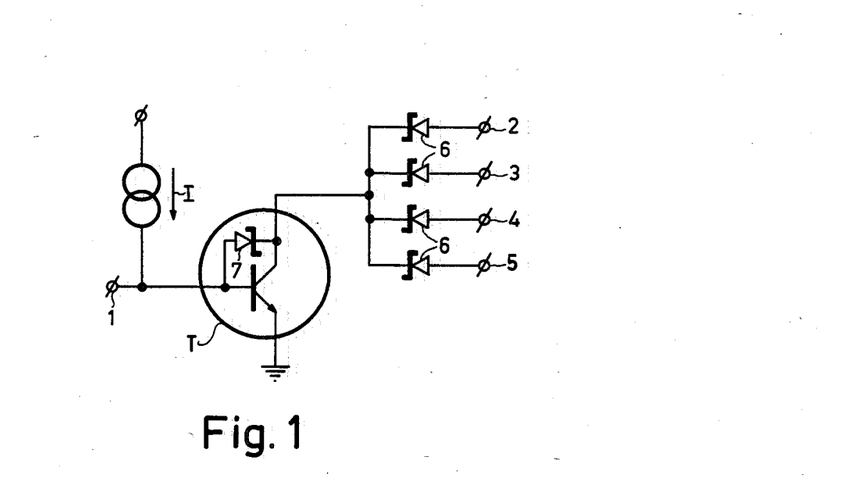
FIG. 1 shows the electric circuit diagram of the known NAND-gate.

The electric circuit diagram of the above-mentioned known NAND-gate, shown in FIG. 1, has a signal input 1 which is formed by the base of a bipolar transistor T and several signal outputs 2, 3, 4 and 5 which are each coupled to the collector of the bipolar transistor T via a diode 6. The signal input 1 has means to supply current, which means are denoted by the current source I.

The transistor T is a planar transistor, the collector-base junction of which is shunted by a Schottky diode 7. Due to said clamp diode the transistor has the high switching speed which is desired nowadays for logic circuits. If the clamp diode 7 is omitted, the transistor in the conductive state will become highly saturated. The transistor then contains a large amount of stored charge, mainly in the form of minority charge carriers, which are situated in the collector region. The switching off of the transistor occurs accordingly slowly. The clamp diode 7 prevents the transistor from becoming saturated so that the said charge storage is avoided.

If during operation the signal input 1 is not connected, the signal input 1 will be charged by the supplied current I to the emitter-base voltage of the transistor T associated with the conductive state. Said diode forward voltage or junction voltage $V_{BE}$ is, for example, approximately 700 to 750 mV for a silicon transistor.

When the voltage at the signal input reaches the diode forward voltage $V_{BE}$, the transistor T becomes conductive and the current I is used as a base current. The current available at one or more of the signal outputs is then dissipated via transistor T, the voltage at the relevant signal output being equal to the diode forward voltage $V_{D1}$ of the coupling diodes 6 augmented by the collector-emitter voltage of the conductive transistor T. Said collector-emitter voltage is equal to the voltage $V_{BE}$ reduced by the diode forward voltage $V_{D2}$ of the clamp diode 7. If the voltage $V_{D2}$ is larger than the voltage $V_{D1}$, the signal output voltage is smaller than $V_{BE}$ and the transistor of a subsequent NAND-gate connected to the relevant signal output will be kept in the non-conductive state.

The swing of the logic signal, that is the difference between the high and the low signal level, is equal to the difference between the diode forward voltages $V_{D2}$ of the clamp diode 7 and $V_{D1}$ of the coupling diode 6.

The Schottky clamp diode 7 is a PtSi-Si-contact with a diode forward voltage $V_{D2}$ of approximately 500 mV. The Schottky coupling diodes 6 are Ti-Si contacts with a diode forward voltage of approximately 350 mV. The logic swing then is approximately 150 mV. This comparatively small logic swing has a favourable effect on the delay time of the gate circuit. When switching from the high to the low signal state, or conversely, only a small voltage difference need be bridged. So the switching can be realizd in a correspondingly short period of time.

So the described known logic circuit owes its attractive circuit technical properties to two things. In the first place this is the use of a high speed planar transistor T which is freed from saturation by means of the Schottky diode 7, and in the second place this is a suitably chosen metallization with metal-to-semiconductor contacts of different compositions which provide schottky diodes with a favourably small difference in diode forward voltage of approximately 150 mV. Hence both in the switching transistor T and in determining the desired logic swing the metallization chosen plays an essential decisive part.

The present invention makes it possible to use, instead of this decisive complex metallization which necessarily is constructed from conductive layers of different materials, a much simpler metallization which, for example, has also been used already in existing products.

Figure 3:
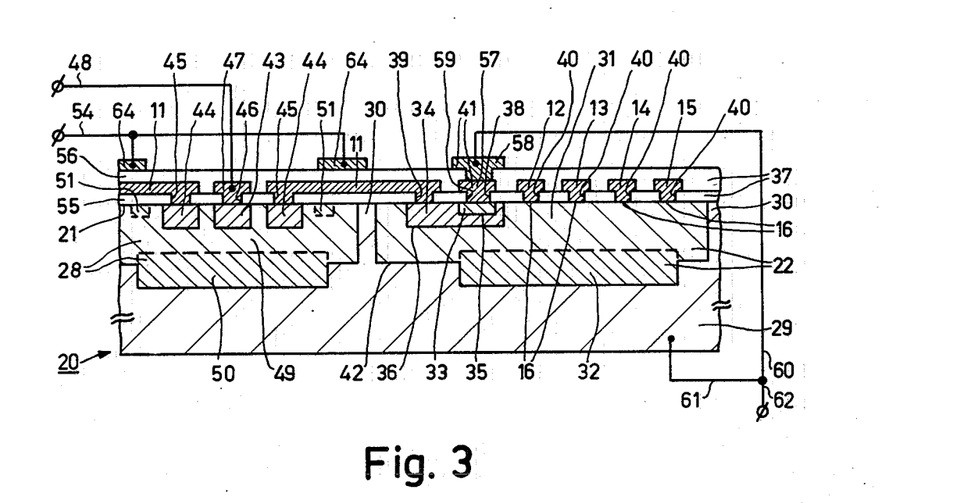
Figure 4:
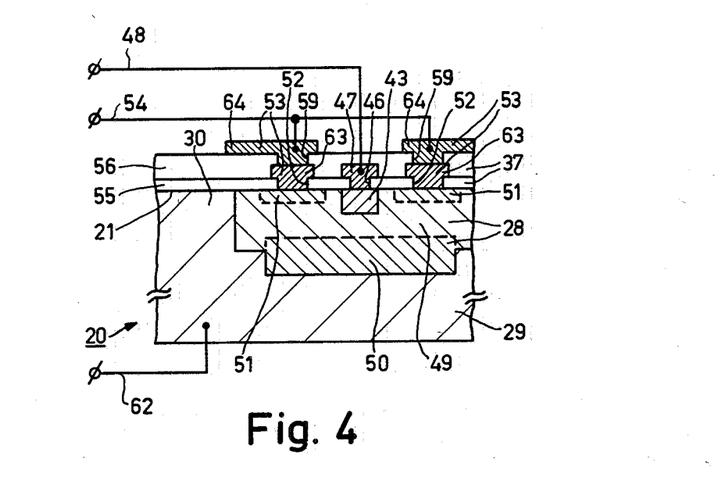

The first embodiment which will be described further with reference to FIGS. 2, 3 and 4 has a semiconductor body 20 having a major surface 21 to which several surface regions 22 to 28 of a first conductivity type adjoin and which are situated on a common substrate region 29 of a second conductivity type opposite to the first. The substrate region 29 may be a common semiconductor layer which is provided, for example, on a substrate. In the present example a p-type semiconductor substrate of silicon is used having a resistivity of, for example, 10 to 15 $\Omega$cm.

At the major surface 21 the surface regions 22 to 28 are each surrounded by an isolation zone 30 by means of which the surface regions are isolated electrically from each other at least during operation. The isolation zones may consist entirely or partly of insulating material. Alternatively, p-type zones may be used extending from the major surface 21 into an n-type surface layer. The p-type isolation zones extend over a part of the thickness of the surface layer or penetrate through the surface layer entirely so that they reach down into the substrate 29. By applying a voltage in the reverse direction across the p-n junctions formed between the isolation zones 30 and the surface regions 22 to 28 and between the substrate 29 and the surface regions 22 to 28, electric isolation between the surface regions 22 to 28 can be ensured in the usual manner during operation.

At least one (22) of the surface regions 22 to 28 serves as a collector region of a bipolar transistor. Said collector region 22 has a high-ohmic part 31 and a low-ohmic part 32, the low-ohmic part 32 extending at and along the interface between the collector region 22 and the substrate region 29.

The bipolar transistor furthermore has an emitter zone 33 of the first conductivity type which adjoins the major surface 21 and which is separated in the semiconductor body 20 from the collector region 22 by a base zone 34 of the second conductivity type extending up to the major surface 21. The n-type emitter zone 33 forms, with the p-type base zone 34, a first p-n junction 35 having a first diode forward voltage $V_{BE}$ and the p-type base zone 34 forms, with the n-type collector region 22, a second p-n junction 36.

Figure 2:
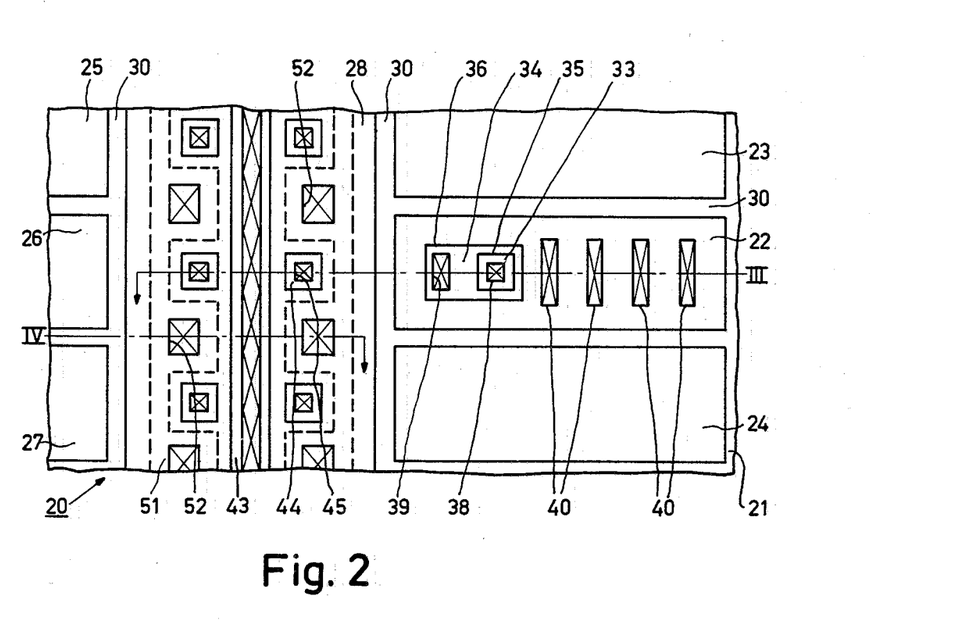
FIG. 2 is a part of a diagrammatic plan view of a first embodiment of the integrated circuit according to the invention.

Present on the major surface 21 is an electrically isolating layer 37 which in the plan view shown in FIG. 2 is considered to be transparent. The layer 37 consists, for example, of an insulating material, for example silicon dioxide or silicon nitride or a combination thereof. A first aperture 38 in the insulating layer 37 is situated above the emitter zone 33. A second aperture 39 is situated beside the emitter zone 33 and above the base zone 34. In addition, beside the base zone 34 and above the collector region 22, several third apertures 40 are present. In FIG. 2, the apertures shown in the insulating layer 37 are illustrated with a cross.

The insulating layer 37 separates conductor tracks 11, 12, 13, 14, 15 and 41 from the semiconductor body 20, which tracks extend into the first, the second and the third apertures 38, 39 and 40, respectively, for the electric connection. For clarity, no conductor tracks are drawn in FIG. 2.

The conductor tracks 12, 13, 14 and 15 extending into the third apertures 40 are each coupled to the collector region 22 via a rectifying junction 16 which adjoins said collector region. In this example the rectifying junctions 16 are metal-to-semiconductor junctions or Schottky junctions, which may comprise platinel silicide contacts as described in, for example, U.S. Pat. No. 3,855,612. The rectifying junctions 16 have a diode forward voltage $V_{D1}$. For the operation of the circuit it is desired that junctions 16 be used having a diode forward voltage $V_{D1}$ which is smaller than the diode forward voltage $V_{BE}$ of the emitter-base-p-n junction 35 of the transistor.

According to the invention, the extent of the low-ohmic part 32 of the collector region 22 in a direction substantially parallel to the major surface 21 is restricted, said low-ohmic part 32 extending below the emitter zone 33 and below the rectifying junctions 16 but does not extend below part of the base zone 34 underlying the second aperture 39 to leave exposed a region in which the high-ohmic part 31 of the collector region immediately adjoins the substrate region 29 while forming a third p-n junction 42. The thickness of the high-ohmic part 31 of the collector region 22 measured between the second and the third p-n junctions 36 and 42, respectively, is preferably smaller than 5 $\mu$m. As a result of this, a vertical complementary auxiliary pnp-transistor the emitter of which is formed by the base zone 34, the base of which is formed by the high-ohmic part 31 of the collector region 22 between the p-n junctions 36 and 42, and the collector of which is formed by the substrate region 29, is incorporated in the npn-transistor structure in an effective manner and substantially without this requiring more semiconductor surface area for the transistor. By additional measures, in this example in that the extent of the buried layer 32 is made smaller than is usual so that below the base contact the substrate region extends up to a comparatively small distance from the base-collector junction 36, the relevant part of the substrate region 29 cooperates effectively as collector of the complementary auxiliary transistor with the adjoining high-ohmic part 31 and the base zone 34. As a result of this, when the inverter transistor is overdriven, a considerable part of the current flowing in the base zone 34 flows through the auxiliary transistor and the storage of mobile charge carriers in the overdriven inverter transistor is reduced considerably, as will be explained hereinafter.

FIG. 2 also shows surface regions 23 to 27 which comprise identical, at least similar circuit elements. So said regions each serve as a collector region of a planar npn-transistor having a number of signal output tracks which are coupled to the relevant collector region via a diode. The number of diodes may vary for each individual transistor between one and, for example, four or five and will depend on the logic function to be generated by the integrated circuit.

The collector regions or islands 22 to 27 are arranged on both sides of an elongate surface region 28 from which the signal inputs 11 are provided with current. In said region 28 a number of lateral pnp-transistors are provided which have a common p-type emitter zone 43. The region 28 serves as a common n-type base zone. The pnp transistors each have a separate p-type collector zone 44 which is connected to a signal input 11 via an aperture 45 in the insulating layer 37. The common emitter zone 43 is connected, via an aperture 46, to a conductor track 47 which has a diagrammatically shown connection 48 for a supply source.

The common base zone 28 has a high-ohmic part 49 and a low-ohmic part 50 in the form of a buried layer. Furthermore, a low-ohmic n-type surface region 51 is present in the base zone 28 which may be provided, for example, simultaneously with the emitter zone 33 and which screens the individual collector zones 44 from each other at least partly. In a corresponding manner the region 51 also constitutes a screening between the emitter and collector zones on the one hand and the isolation zones 30 on the other hand. The buried layer 50 and the surface region 51 serve to reduce the base series resistance and to suppress parasitic transistor action to the substrate and/or the isolation zones and between the collector zones mutually. Above the surface region 51 there are apertures 52, 59 in the insulating layer 37 through which the common base zone 28 is connected to conductor tracks 53.

The integrated circuit is constructed with a metallization which comprises several layers, as is common for complex LSI circuits nowadays. For that purpose, the insulating layer 37 consists of a first or lowermost layer 55 having the apertures 38, 39, 40, 45, 46 and 52 and a second or uppermost layer 56. A first level of conductor tracks which comprises inter alia the conductor tracks 11 to 15 and 47 is situated on the lowermost layer 55. The conductor tracks 41 and 53 consist of two parts of which first parts 57 and 63, respectively lie at the first level and extend into the apertures 38 and 52, respectively, and second parts 58 and 64, respectively lie on a second level which is separated from the first level by the uppermost layer 56 and are directly connected to the first parts 57 and 63, respectively, via apertures 59.

The second parts 64 of the conductor tracks 53 are, for example, comb-shaped, the base of the comb extending substantially parallel to the emitter zone 43 and the conductor tracks 47, and projections or teeth of the comb extending from the base of the comb towards and into the apertures 59 in the insulating layer 37. The second parts 64 may also be connected to a connection 54, shown diagrammatically, for the conductor tracks 53.

The conductor tracks 11 to 15, 47 and 57 of the first level may be, for example, aluminium or another suitable conductive material. If desired, a barrier layer may be used to avoid direct contact between the aluminium and the platinel silicide formed in the apertures in the insulating layer. As a barrier layer may be used, for example, titanium-platinum or titanium-tungsten or rhodium.

The conductor tracks 58 and 64 of the second level are, for example of aluminium or titanium-platinum-gold.

Preferably, the same material is in direct contact with the semiconductor body in all apertures 38, 39, 40, 45, 46 and 52 in the first insulating layer 37 and notably in the first, the second and the third apertures 38, 39 and 40. In the present example this material is the said platinel silicide which in the apertures 40 forms a Schottky diode and which, in the other apertures, forms a readily conductive junction between the conductor tracks and the semiconductor regions adjoining same in said apertures.

The conductor track 41 connected to the emitter zone 33 is provided with a connection 60, shown diagrammatically, and the substrate region 29 has a connection 61 which may be connected to the connection 60 to form a common connection 62 for a supply source.

The connection 62 may be connected to a suitable reference potential, for examle ground potential. A suitable current or voltage supply source is connected between the connections 62 and 48. The connection 54 is connected to a suitable reference potential, the p-n-p transistors being conductive. The integrated circuit furthermore has one or more signal inputs, not shown, via which input signals can be supplied to one or more conductor tracks 11, and one or more signal outputs, not shown, via which output signals generated by the integrated circuit can be derived. For completeness' sake it is noted that the second level of conductor tracks may be covered entirely or partly with a further insulating layer, if so desired.

The embodiment described has a combination of properties which are particularly suitable for LSI circuits. First of all, the manufacturing process necessary for said integrated circuits is considerably simpler than for the described known circuit. The integrated circuit according to the invention can be manufactured with the same available process in which, for example, LS TTL and I$^2$L can also be manufactured. In contrast with the known circuit described, LS TTL and I$^2$L are both on the market as commercial products. Comparison of the integrated circuit according to the invention with the said two commercial products gives a good picture of the particular suitability and the applicability of the proposed new LSI logic. In such a comparison it is not only of importance that the products to be compared should be manufactured in the same or substantially the same process but also that comparable design rules for the topology or lay-out should be used. The results to be mentioned hereinafter are based on a comparison in which for all three products it has been assumed that the smallest detail to be realized in the masks must have a length of at least 5 $\mu$m. Furthermore, an n-type epitaxial layer in a thickness of approximately 3 $\mu$m and a resistivity of approximately 0.7 $\Omega$cm was used for the circuit according to the invention. As stated, the Schottky coupling diodes were of a type which is also usual in LS TTL having a platinel silicide junction. The diode forward voltage of said diodes was approximately 0.48 V.

As is known, the conventional I$^2$L is comparatively slow as compared with LS TTL. The minimum delay time of an I$^2$L inverter having a single output is approximately 10 to 20 nsec., whereas for LS TTL the minimum delay time is in the proximity of approximately 5 to 7 nsec. The switching times given here are realized in I$^2$L and LS TTL integrated circuits, respectively, with an epitaxial layer having a thickness of approximately 3 $\mu$m. The resistivity of the epitaxial layer for I$^2$L circuits is approximately 0.7 $\Omega$cm, whereas for LS TTL circuits a value of approximately 0.3 ohm cm has been assumed.

It is very surprising that the minimum delay time for the circuit according to the invention is approximately 3 to 3.5 nsec. This minimum delay time was measured at a current level of approximately 400 $\mu$A. The emitter-base-diode forward voltage was approximately 760 mV and the collector-emitter voltage $V_{CE}$ of the conductive inverter transistor was approximately 60 mV. The swing of the logic signal was approximately 220 mV.

In spite of the fact that the inverter transistor in LS TTL is kept from saturation by means of a Schottky clamp diode and the inverter transistor in the circuit according to the invention does become saturated, the latter circuit nevertheless has a delay time which is approximately two times smaller. The comparable I$^2$L inverter which also becomes saturated on the contrary has a 3 to 6 times larger delay time. Apparently, the restriction of the extent of the buried layer as indicated is an unexpectedly effective means in which on the one hand the internal series resistance in the collector region is not increased or is hardly increased, while on the other hand a particularly effective complementary auxiliary transistor is obtained which drastically reduces the consequences of the fact that the inverter transistor becomes saturated and which readily controls the extent to which the inverter transistor becomes saturated.

Another quantity which is frequently used for comparison is the product of the delay time $\tau$ and the power dissipation D. For LS TTL this $\tau$D product is approximately 19 pJ, for I$^2$L and the circuit according to the invention the $\tau$D product is of approximately the same value, namely 0.5 to 2 pJ. So the integrated circuit according to the invention also compares well in this respect.

A third quantity which is extremely important for LSI circuits is the packing density or the number of gate circuits which can be realized on an average per mm$^2$ of semiconductor surface area. In this respect, as is known, I$^2$L with a packing density of approximately 200 to 250 gates/mm$^2$ is superior to LS TTL which has a packing density of 15 to 20 gates/mm$^2$. The packing density of the integrated circuit according to the invention is 120 to 180 gates/mm$^2$. So this is approximately a factor 6 or more favourable than for LS TTL and less than a factor 2 worse than for I$^2$L.

So the present invention provides a considerable improvement with respect to LS TTL and notably is significantly competitive with respect to I$^2$L for applications that require a switching speed that is not attainable by conventional I$^2$L. In I$^2$L switching speeds of a few nsec can be realized in practice only if dielectric isolation is used. However, the associated manufacturing process is more complicated than the conventional manufacturing process so that easily a comparatively high cost-price results. Furhermore, for corresponding reasons as is the case with I$^2$L, the switching speeds in the integrated logic circuit according to the invention can also be increased by using dielectric isolation.

In the second embodiment which will be described with reference to FIGS. 5 and 6, a number of further measures have been taken to improve the integrated circuit. In this example, the same reference numerals are used as in the first example for corresponding parts of notably the inverter transistor and the coupling diodes.

Figure 5:
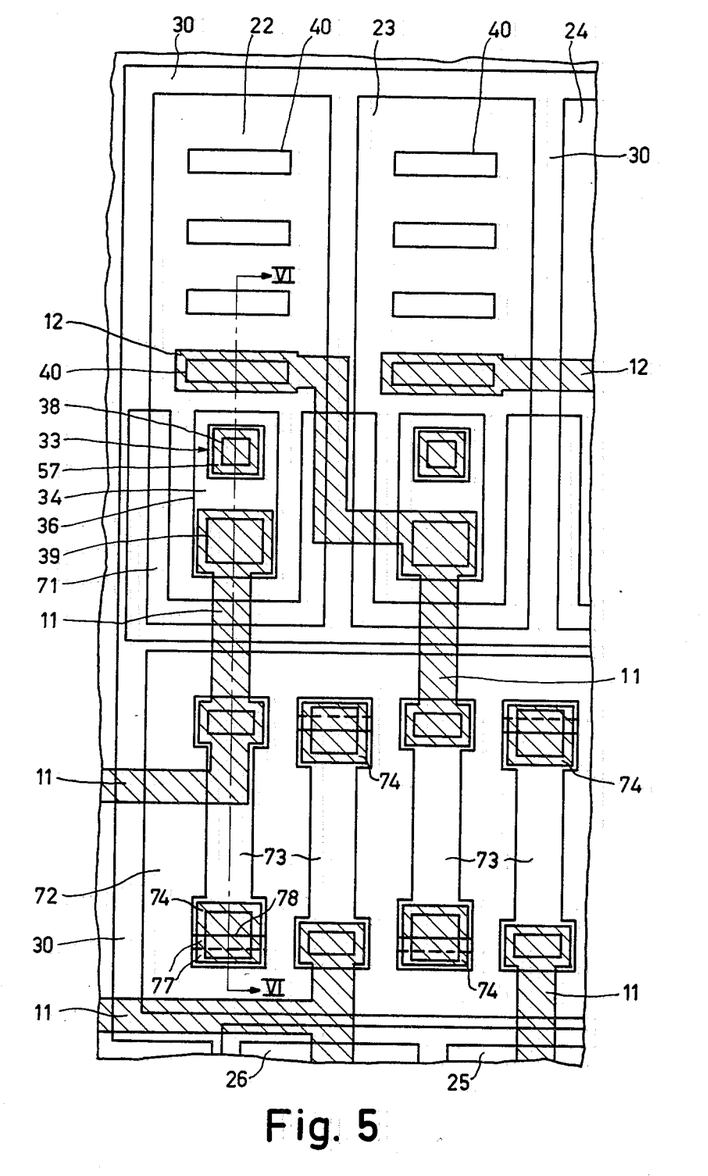
FIG. 5 shows diagrammatically a part of a second embodiment of the integrated circuit according to the invention.
Figure 6:
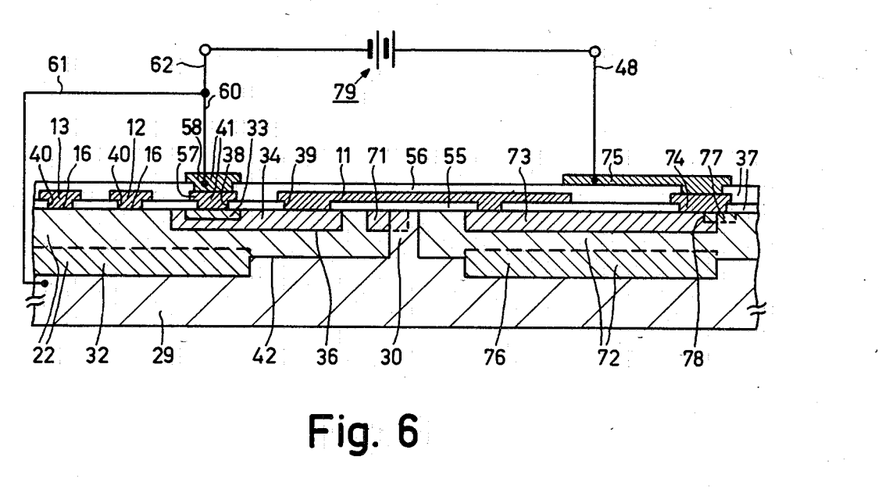
FIG. 6 is a diagrammmatic cross-sectional view of said second embodiment taken on the line VI—VI.

In the plan view of FIG. 5 some of the conductor tracks at the first level are shown. They are, inter alia, the conductors 11, 12 and 57. For clarity, the conductor tracks shown are shaded.

A first measure to improve the switching speed is that the non-active part of the base zone 34 is enlarged and is significantly larger than is necessary for providing a base contact, while nevertheless the extent of the buried layer 32 is restricted to the region below the emitter zone 33 and the active part of the base zone 34.

The active part of the base zone 34 is to be understood to mean in this connection that part which is necessary to accommodate an emitter zone 33. Adjoining said active part, a non-active part of the base zone 34 is necessary for the electric connection of the conductor track 11.

If in the present examples an emitter zone 33 of, for example, 12 $\mu$m $\times$ 12 $\mu$m with an associated contact aperture 38 of approximately 6 $\mu$m $\times$ 6 $\mu$m is used and a minimum of 3 $\mu$m is maintained for the distance at the semiconductor surface between the emitter-base junction 35 and the base-collector junction 36, the active part of the base zone necessary for the emitter zone is 18 $\mu$m $\times$ 18 $\mu$m. However, at least one contact aperture for contacing the base is necessary beside the emitter zone. Said contact aperture 39 is, for example, 5 $\mu$m $\times$ 10 $\mu$m. If in addition a minimum distance of approximately 6 $\mu$m between the conductors 57 and 11 extending into the apertures 38 and 39 is taken into account, the base zone 34 as a whole will be 18 $\mu$m $\times$ 32 $\mu$m. The non-active part of the base zone 34 destined for contacting hence is at least 18 $\mu$m $\times$ 14 $\mu$m. With the dimensions indicated, the non-active part has a surface area which is more than 20% smaller than the active part.

In the present second example a base zone 34 is used of 37 $\mu$m $\times$ 18 $\mu$m having therein the same emitter zone of 12 $\mu$m $\times$ 12 $\mu$m. So in this case the active part also has an area of 18 $\mu$m $\times$ 18 $\mu$m. The non-active part in this case measures 18 $\mu$m $\times$ 19 $\mu$m. In this second example the non-active part hence is approximately 35% larger in area than in the first example. In addition, the non-active part in this second example even has a larger area than the active part. Within the scope of the present invention, the non-active part of the base zone 34 which comprises the emitter of the vertical complementary auxiliary transistor preferably is at least equally large as the active part.

In the second example, the larger base zone 34 is used to enlarge the contact aperture 39. Instead of an aperture of 5 $\mu$m $\times$ 10 $\mu$m, an aperture 39 of 10 $\mu$m $\times$ 10 $\mu$m is used in this case. So the aperture 39 is 2 times as wide as is minimally necessary. In itself the said widening of the aperture 39 is not necessary for the proper operation of the integrated circuit. Independently of the aperture 39 actually present, the extension of the base zone 34 as proposed within the scope of the present invention will preferably be of such a nature that the non-active part of the base zone 34 is so large that sufficient area is available to be able to use a contact aperture 39 having a width which is larger than the smallest dimension of the apertures 40 for the coupling diodes. The available area is preferably sufficiently large for a contact aperture having a width which is at least equal to 2 times the smallest dimension of the apertures 40. In the two examples the apertures 40 have dimensions of 5 $\mu$m $\times$ 22 $\mu$m.

For completeness' sake it is to be noted that the above-indicated dimensions relate for simplicity to the masks which are necessary for the various photolithographic treatments during the manufacture. As is known, the actual dimensions in the integrated circuits themselves slightly differ inter alia because upon exposure and development of the photosensitive lacquer a really exact reproduction of the masks is not obtained, because during the etching treatments undercutting often occurs and because upon diffusion of impurities, lateral diffusion also occurs.

As a result of the indicated enlargement of the base zone 34, the oppositely located parts of the p-n junctions 36 and 42 also obtain a larger area. So in fact the incorporated vertical p-n-p auxiliary transistor is enlarged as a result of which excessive base current of the conductive inverter transistor can be dissipated more effectively and at a lower forward voltage across the p-n junction 36. The conductive inverter transistor is less overdriven and the storage of charge in the collector region 22 is accordingly reduced.

In the above paragraphs is assumed that the inverter transistor has a single emitter zone 33 and a single base contact aperture 38. Dependent inter alia on the desired current level, for example, two conductively interconnected emitter zones may also be used. Alternatively, several base contact apertures may be present, for example, two contact apertures on oppositely located sides of a single emitter zone. When several base contact apertures are used, an auxiliary transistor need not necessarily be incorporated below each of the base contacts. The collector region 22 of the inverter transistor preferably is substantially rectangular and the apertures 38, 39 and 40 in the insulating layer are situated beside each other in the same direction, the aperture or apertures 38 and the associated emitter zone or zones 33 being situated between the apertures 40 for the coupling diodes on one side and the or at least one of the apertures 39 for the base contact on the other side. The desired incorporated vertical auxiliary transistor is preferably situated below the last-mentioned outermost contact aperture. The buried layer 32 preferably continues uninterruptedly from below the emitter zone 33 to below the coupling diodes 16.

A further measure to improve the switching speed is that an improved lateral auxiliary transistor is incorporated by the addition of a further surface zone 71 which during the manufacture can be obtained simultaneously with the base zone 34. The zone 71 has the same conductivity type as the base zone 34 and as the isolation zone 30 and at the semiconductor surface coincides partly with the isolation zone 30. The zones 71 and 30 overlap each other. It is of importance that the base zone 34 and the isolation zone 30 are obtained with different diffusion treatments so that their mutual distance at the semiconductor surface must be comparatively large. The base zone 34 and the zone 71 on the contrary are obtained simultaneously with the same diffusion treatment so that their mutual distance can be comparatively small. They have substantially the same depth of penetration in the semiconductor body and they have substantially the same variation in doping concentration in a direction transverse to the major surface. A usual distance between the base zone 34 and the isolation zone 30 is, for example, approximately 10 μm. The distance between the base zone 34 and the further surface zone 71 need not be more than 5 μm. The zones 34 and 71 constitute the emitter and the collector of an effective lateral auxiliary transistor the base thickness of which is 5 μm or less. If the inverter transistor is conductive, said auxiliary transistor also dissipates current so that the inverter transistor is less overdriven.

As stated, the base width of the lateral auxiliary transistor is preferably at most 5 μm. In the present example the indicated distances of 10 and 5 μm apply to the masks to be used in the manufacture and the corresponding dimensions in the integrated circuit are smaller, in particular due to the occurence of lateral diffusion. The distance between the base zone 34 and the isolation zone 30 will on an average be approximately 7 μm. The base width of the lateral auxiliary transistor actually is approximately 3 μm.

In this embodiment having a lateral complementary auxiliary transistor the additional surface zone 71 constitutes the region of the second conductivity type which effectively serves as collector of the auxiliary transistor.

The further surface zone 71 may have a closed geometry and surround the base zone 34 as a ring, in which it extends between the base zone 34 on the one side and the coupling diodes 16 on the other side. Preferably, however, the further zone 71 is open on the side of the coupling diodes 16 and surrounds the base zone 34 only at the part of the edge of the base zone not facing the coupling diodes. Therefore in the present example the zone 71 is in the form of a U.

The use of a zone 71 having a non-closed geometry is based on the recognition of the fact that such a zone is substantially superfluous on the side of the base zone 34 facing the coupling diodes 16. Notably, if the coupling diodes are Schottky diodes, the life time of the minority charge carriers in the collector region 22 at the rectifying junctions 16 is very small. In particular the first coupling diode situated nearest the base zone 34 will draw minority charge carriers from the collector region and thus fulfils substantially the same function as the zone 71. As a result of this, a slightly larger current will flow through the first coupling diode than through the remaining coupling diodes which are situated farther away. This difference in current level, however, is so small that the proper electrical operation of the circuit is not endangered. The inverter transistors have amply sufficient gain to be able to absorb said current differences.

The shape selected for the further surface zone 71 has the important advantage that no extra area is necessary at the semiconductor surface. A closed shape or ring surrounding the whole collector region would restrict the area available for the coupling diodes. A closed shape or ring surrounding the base zone 34 and extending between the base zone 34 and the first coupling diode 16 would necessitate a larger distance between said base zone 34 and the first coupling diode 16.

Another measure by which the switching speed can be increased is to replace the lateral p-n-p transistor 43, 28, 44 of the first example used for the supply of current by a resistor in combination with a lowest possible supply voltage of 1 V or less. The supply voltage preferably is at most equal to the sum of the diode forward voltage $V_{BE}$ of the inverter transistor and the swings of the logic signal, or in other words, at most equal to approximately $2V_{BE} - V_{D1}$, where $V_{D1}$ is the diode forward voltage of the coupling diodes.

The last-mentioned measure has also been realized in the second example. The collector regions 22 to 26 of the inverter transistors are arranged on the oppositely located sides of a common surface region or island 72. Said island 72 comprises a number of resistors 73 which are each connected to a signal input conductor 11. The resistors 73 furthermore comprise connection contacts in the form of a conductive layer 74 which, as the conductive layers 57 connected to the emitter zone 33, belong to the first level of conductor tracks. The conductive layers 74 serve for the connection to a supply line 75 which is not shown in FIG. 5 and extends horizontally in the plane of the drawing of FIG. 5 substantially centrally above the resistors 73. Said horizontal supply line 75 belongs to the conductor tracks of the second level and has projections which in the plane of FIG. 5 are directed alternately upwards and downwards and which are connected to the layers 74 through an aperture in the insulating layer 56 which separates the conductor tracks of different levels from each other.

The second supply line 58 also belongs to the conductor tracks of the second level and is not shown in the drawing of FIG. 5. The supply line 58 extends substantially parallel to the supply line 75 and overlies the emitter zone 33.

Finally FIG. 5 shows a few signal input conductors 11 and signal output conductors 12 which belong to the first level of conductor tracks. In so far as signals of other parts of the integrated circuit situated farther away are to be supplied to the inverter transistors shown, at least two positions situated between the electric connections of the resistors 73 in a direction parallel to the supply lines are available. In addition, a position may sometimes be used between the resistors and the inverter transistors as is shown at the bottom of FIG. 5. Furthermore, signal conductors crossing each other can also be realized by means of the second level of conductor tracks.

The resistors 73 have a structure which is usual for integrated circuits. They are p-type zones which can be obtained simultaneously with the base zones 34. Said zones 73 are situated in the common island 72 above a buried layer 76 belonging to the island 72. A more highly doped n-type surface zone 77 is provided at the end of the resistors 73 connected to the supply line 75, simultaneously with the emitter zones 33. The p-n junction 78 formed at the boundary of the zones 73 and 77 is short-circuited by the overlying conductive layer 74. The supply line 75 is connected directly to the common island 72 via the surface zones 77.

It will be clear that not all resistors need be connected on one side to the common island 72 via an adjoining surface zone 77 and a short-circuited p-n junction 78. For example, one single connection between the supply line 75 and the common island 72 will in itself often suffice already. Only the leakage currents of the various p-n junctions need be dissipated via the connection to the supply line, so that the current through said connection is comparatively small.

The sheet resistance of the zones 73 is, for example, approximately 200 ohm. The resistors each have a value of, for example, approximately 800 ohm.

The supply line 75 is connected to a connection 48, and the supply line 58, as well as the substrate region 29, is connected to the connection 62. Between the connections 48 and 62 a supply voltage can be applied of, for example, approximately 920 mV. Said supply is shown diagrammatically in FIG. 6 by the voltage source 79.

The selected supply voltage is equal to the sum of the diode forward voltage $V_{BE}$ of the inverter transistor and the logic swing. The logic swing is equal to the voltage $V_{BE}$ decreased by the diode forward voltage $V_{D1}$ and the collector-emitter voltage $V_{CE}$ of the conductive inverter transistor.

During operation, the output of a first gate circuit having a conductive inverter transistor is connected to the input of a second gate circuit whose inverter transistor then is non-conductive. A voltage drop equal to the logic swing will occur across the resistor associated with the first gate circuit. In fact, the input signal is high and equals the base-emitter forward voltage $V_{BE}$. A voltage drop which is twice as large as the logic swing will occur across the resistor associated with the second gate circuit. In this case the input signal is low and is approximately equal to the sum of the diode forward voltage $V_{D1}$ and the voltage $V_{CE}$ of the conductive transistor. The current which flows through the second resistor and which is dissipated via the collector of the conductive transistor thus is approximately twice as large as the current which flows through the first resistor and which is supplied to the conductive transistor as a base current. So the conductive transistor clearly is less overdriven than would have been the case with a more ideal current source supply. In the latter case the base and collector currents would have been substantially equally large, while in this example as a result of the low supply voltage in combination with the resistors 73, a factor of two difference occurs. The charge storage in the inverter transistor is decreased accordingly.

Also when a higher supply voltage is used it may be of advantage to supply the currents via resistors to the bases of the inverter transistors. The resistance values of the resistors will then have to be larger. If necessary, the resistors may be manufactured in known manner by means of ion implantation. In that case, resistance zones having a sheet resistance of, for example, approximately 2K $\Omega$ can simply be obtained. Alternatively the resistors may be provided on the body instead of in the semiconductor body, for example, with a layer of resistance material, such as titanium, tantalum or polycrystalline semiconductor material, obtained by deposition or otherwise.

In the examples described, current is dissipated to the connection 61 via the vertical and/or the horizontal complementary auxiliary transistor. Said electric connection 61 constitutes the connection of the collector of the auxiliary transistor. In order to reduce the series resistance, another arrangement may be favourable in which this connection either does not contact the substrate 29 or is connected to it not only at the lower side of the substrate; in this other arrangement, on the upper side of the semiconductor body, the deep p-type zones 30 are connected to a conductor track, and for example, to the supply line 58 preferably at locations situated at a regular distance from each other. If the isolation zones consist of insulating material throughout their depth or over a part of their depth, it is recommendable to provide deep semiconductor zones, in places regularly arranged between or beside the gate circuits, which zones extend from the semiconductor surface down to the substrate region and which are connected at the semiconductor surface to a conductor track and which in this manner may serve for the desired dissipation of current.

The integrated logic circuits described can be manufactured entirely in the usual manner by means of methods conventionally used in semiconductor technology.

It will be obvious that the invention is not restricted to the embodiments described but that many variations are possible to those skilled in the art without departing from the scope of this invention. For example, other semiconductor materials, such as germanium or $A_{III}$-$B_V$ compounds, may be used. Furthermore, the conductivity types in the examples may be interchanged, the electric voltages and current directions being adapted accordingly. The thickness of the surface layer is preferably not larger than approximately 6.5 $\mu$m. Advantageously a thickness of at most approximately 3.5 $\mu$m is used. The surface layer will usually be an epitaxial layer but may also be obtained differently, for example, by diffusion or ion implantation. The collector regions can also be provided as separate regions by doping in a substrate of the opposite conductivity type. The resistivity or in general the doping concentration of the surface layer may be adapted within wide limits. For example, instead of the epitaxial layer of 0.7 ohm.cm an epitaxial layer of approximately 0.3 ohm.cm may alternatively be used readily. Said resistivity influences inter alia the series resistance of the coupling diodes.

Both for the vertical auxiliary transistor and for the lateral auxiliary transistor it holds that the base width of the auxiliary transistor between the emitter and the collector is preferably approximately 3 $\mu$m or less.

The inverter transistor may alternatively be constructed so as to be symmetrical with respect to the non-active part of the base zone which comprises the emitter of the auxiliary transistor. In that case the relevant base contact will be situated centrally, an emitter zone and one or more coupling diodes being present on two opposite sides of said contact. On each of the said sides a buried layer will be present which continues uninterruptedly from below the emitter zone to below the coupling diode(s). If a lateral auxiliary transistor is incorporated in such a symmetrical transistor, the region which serves as collector thereof, will consist of two parts which are situated beside the two other opposite sides of the base zone not facing coupling diodes.

The activator concentration in the part of the substrate region which is situated as collector of the vertical auxiliary transistor opposite to the base zone of the inverter transistor, is preferably at least a factor of 10 and advantageously at least a factor of 100 lower than the activator concentration in the low-ohmic part of the collector region of the inverter transistor.

Alternatively, the coupling diodes 16 may be obtained by means of material other than the said platinel silicide. For example, aluminium, platinum silicide or titanium may be used. This material may be present only in the apertures in the insulating layer, as with the described platinel silicide junctions, or may form part, as a layer, of the conductor tracks, as is often the case with titanium. The layer of titanium is then coated with a readily conductive layer of, for example, gold in which, if necessary, a barrier layer of, for example, platinum may be interposed.

What is claimed is:

1. An integrated logic circuit having a signal input which is formed by a base of a primary bipolar transistor and having a plurality of signal outputs each coupled, through a diode, to the collector of the primary bipolar transistor, the signal input comprising means to supply current, the integrated circuit comprising a semiconductor body having a major surface to which several surface regions of a first conductivity type adjoin which are situated on a common substrate region of a second conductivity type opposite to the first, each of said surface regions being surrounded at the major surface by an isolation zone by means of which the surface regions are isolated electrically from each other at least during operation, one of said surface regions of the first conductivity type serving as a collector zone of the primary bipolar transistor, said primary bipolar transistor furthermore having a major surface-adjoining emitter zone of the first conductivity type which is separated from the collector zone in the semiconductor body by a base zone of the second conductivity type extending up to the major surface and which forms a first P-N junction with said base zone, the base zone forming a second P-N junction with the collector zone, an electrically insulating layer being present on the major surface and having a first aperture which overlies the emitter zone, a second aperture which is situated beside the emitter zone above the base zone and several third apertures which are situated beside the base zone above the collector zone, the insulating layer separating conductor tracks from the semiconductor body which extend into the first, the second and the third apertures for electric connection, the conductor tracks extending into the third apertures being each coupled to the collector zone through a rectifying junction which adjoins the collector zone, said collector zone of the primary bipolar transistor having a high-ohmic and a low-ohmic part, the low-ohmic part extending at and along the interface between the collector zone and the substrate region, the extent of the low-ohmic part of the collector zone in a direction substantially parallel to the major surface being restricted, said low-ohmic part extending below the emitter zone and below the rectifying junctions and terminating at a location which exposes, below the base zone and the overlying second aperture in the insulating layer, a region in which the high-ohmic part of the collector zone directly adjoins the substrate region while forming a third P-N junction, the part of the substrate region adjoining the high-ohmic part of the collector zone cooperating as collector of a vertical auxiliary transistor with the adjoining collector zone and the base zone of the primary bipolar transistor constituting the base and emitter, respectively, of said auxiliary transistor, an electrical connection formed at the part of the substrate region constituting the collector of said vertical auxiliary transistor, a further surface zone of the second conductivity type adjoining the collector zone of the primary bipolar transistor and disposed at the major surface beside the base zone and extending into the semiconductor body from the major surface down to substantially the same depth as the base zone, said further surface zone serving as collector of a lateral auxiliary transistor and being connected to the sbustrate region, the base zone of the primary bipolar transistor at the major surface being surrounded only partly by the further surface zone, the circumference of the base zone situated at the major surface being situated partly opposite to one or more of said third apertures and for the whole remaining part being situated opposite to the further surface zone, whereby if the primary bipolar transistor is overdriven, a considerable part of the current flowing in the base zone of the primary bipolar transistor can flow through the auxiliary transistors and the storage of mobile charge carriers in the overdriven primary bipolar transistor can be restricted considerably.

2. An integrated logic circuit as claimed in claim 1, characterized in that the base zone of the primary bipolar transistor is substantially rectangular, the further surface zone being substantially in the form of a U and surrounding the base zone on three sides, the third apertures in the insulating layer being arranged on the fourth side of the base zone beside said base zone.

3. In an integrated logic circuit comprising a semiconductor body having a major surface and a P-type substrate region and plural N-type epitaxial surface-adjoinging electrically-isolated pockets, plural primary bipolar inverter down transistors each having emitter, base and collector zones and each incorporated in an isolated pocket in such manner that the N-type epitaxial material constitutes the transistor's collector zone, and the transistor's emitter and base zones are constituted by nested surface-adjoining N- and P-type zones in the N-type collector zone forming emitter and collector P-N junctions, said pocket isolation comprising an annular surface P-type isolation region completely surrounding but spaced from the primary transistor base zone and extending vertically down and electrically connected to the P-type substrate region, a further P-type surface zone formed in the body which overlaps with the P-type isolation region but which is laterally spaced closer to the primary transistor base zone than is the isolation region, said further P-type surface zone having substantially the same depth as the P-type base zone of the primary transistor, but a lateral extension which is smaller than the P-type isolation region and thus only partially surrounds the primary transistor base zone at the surface, an insulating layer on the semiconductor body major surface and having openings over the emitter and base zones and plural openings over the collector zones, first ohmic metal contacts to the emitter and base zones via the openings, and second spaced Schottky metal contacts to the collector zones of each transistor via the openings and forming therewith plural Schottky junctions, a current source, an N-Plus-type buried layer in each of the pockets underneath but mainly spaced from the P-type base zone and extending horizontally along the interface between the N-type pocket and the P-type substrate and means comprising conductive tracks on the insulating layer selectively connecting a Schottky contact of a preceding transistor to the base zone of a succeeding transistor and coupling a current source and signal input to the base zone of said succeeding transistor and coupling outputs to Schottky metal contacts thereof thereby forming a common emitter logic circuit having Schottky diode output decoupling and utilizing the lower saturated voltage of the preceding saturated primary ON transistor which sinks the current source to prevent turn-on of the succeeding transistor having a higher emitter-base turn-on voltage, said saturation condition tending to establish increased excess charge carriers at the collector PN junction of the saturated primary transistor thereby tending to increase the turn-off time for the saturated transistor to invert its logic state, in combination with means for rapidly removing excess charge from the collector zone of the primary transistor when saturated thereby reducing its turn-off time, said charge-removing means comprising an auxiliary complementary bipolar transistor incorporated in the pocket containing said primary saturated transistor and comprising both a vertical down P-N-P transistor and a lateral P-N-P transistor, said down P-N-P transistor comprising P-type emitter, N-type base and P-type collector zones merged, respectively, with the P-type base and N-type collector zones of the primary transistor and the P type substrate region underlying the pocket of the primary transistor, and the lateral P-N-P transistor comprising emitter, base and collector zones merged, respectively, with the base and collector zones of the primary transistor and the P-type isolation region, the base zone of said vertical down auxiliary transistor having a portion underneath the base zone contact substantially free of the N-Plus-type buried layer having a base zone width of 5 microns or less.

* * * * *